United States Patent
Bharitkar et al.

(10) Patent No.: US 11,380,347 B2
(45) Date of Patent: Jul. 5, 2022

(54) ADAPTIVE SPEECH INTELLIGIBILITY CONTROL FOR SPEECH PRIVACY

(71) Applicant: HEWLETT-PACKARD DEVELOPMENT COMPANY, L.P., Houston, TX (US)

(72) Inventors: Sunil Bharitkar, Palo Alto, CA (US); Wensen Liu, San Diego, CA (US); Madhu Sudan Athreya, Palo Alto, CA (US); Richard Sweet, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 745 days.

(21) Appl. No.: 16/076,272

(22) PCT Filed: Feb. 1, 2017

(86) PCT No.: PCT/US2017/016008
§ 371 (c)(1),
(2) Date: Aug. 7, 2018

(87) PCT Pub. No.: WO2018/143979
PCT Pub. Date: Aug. 9, 2018

(65) Prior Publication Data
US 2021/0183402 A1 Jun. 17, 2021

(51) Int. Cl.
*G10L 21/0364* (2013.01)
*G10L 21/02* (2013.01)
(Continued)

(52) U.S. Cl.
CPC ............ *G10L 21/0364* (2013.01); *G06T 7/70* (2017.01); *G10L 21/02* (2013.01); *G10L 21/034* (2013.01);
(Continued)

(58) Field of Classification Search
CPC .. G10L 21/0364; G10L 21/02; G10L 21/0316
See application file for complete search history.

(56) References Cited

U.S. PATENT DOCUMENTS 6,317,613 B1 * 11/2001 Brown, Jr. ............. H04B 1/082
370/202
7,599,507 B2 10/2009 Hansen
(Continued)

FOREIGN PATENT DOCUMENTS

JP 2015084499 A * 4/2015
WO 2001099389 A2 12/2001
(Continued)

OTHER PUBLICATIONS

Jang et al., "Shadow Sound System Embodied with Directional Ultrasonic Speaker", Retrieved from internet—https://www.computer.org/csdl/proceedings/icisa/2013/0602/00/06579499.pdf, 2013, 3 Pages.

*Primary Examiner* — Bryan S Blankenagel
(74) *Attorney, Agent, or Firm* — Mannava & Kang

(57) ABSTRACT

In some examples, adaptive speech intelligibility control for speech privacy may include determining, based on background noise at a near-end of a speaker, a noise estimate associated with speech emitted from the speaker, and comparing, by using a specified factor, the noise estimate to a speech level estimate for the speech emitted from the speaker. Adaptive speech intelligibility control for speech privacy may further include determining, based on the comparison, a gain value to be applied to the speaker to produce the speech at a specified level to maintain on-axis intelligibility with respect to the speaker, and applying the gain value to the speaker.

18 Claims, 15 Drawing Sheets

(51) Int. Cl.
*G10L 21/0316* (2013.01)
*G06T 7/70* (2017.01)
*G10L 21/034* (2013.01)
*G10L 25/60* (2013.01)
*G10L 25/84* (2013.01)
*H04R 1/32* (2006.01)
*H04R 17/00* (2006.01)

(52) U.S. Cl.
CPC .......... *G10L 21/0316* (2013.01); *G10L 25/60* (2013.01); *G10L 25/84* (2013.01); *H04R 1/323* (2013.01); *H04R 17/00* (2013.01); *G06T 2207/30196* (2013.01)

(56) References Cited

U.S. PATENT DOCUMENTS

| | | | |
|---|---|---|---|
| 9,037,468 B2 | 5/2015 | Osman | |
| 9,485,556 B1 | 11/2016 | List | |
| 2001/0055399 A1 | 12/2001 | Ullrich | |
| 2008/0205195 A1* | 8/2008 | Van Der Merwe | G10K 15/02 367/137 |
| 2009/0132248 A1* | 5/2009 | Nongpiur | G10L 21/0208 704/233 |
| 2010/0027832 A1 | 2/2010 | Koseki | |
| 2010/0076769 A1* | 3/2010 | Yu | G10L 21/0208 704/269 |
| 2012/0114137 A1* | 5/2012 | Tsurumi | H04S 7/303 381/92 |
| 2012/0263317 A1 | 10/2012 | Shin et al. | |
| 2013/0259254 A1 | 10/2013 | Xiang et al. | |
| 2013/0262103 A1* | 10/2013 | Reiswig | H04R 29/007 704/235 |
| 2014/0334669 A1* | 11/2014 | Acharya | G06F 3/0304 382/103 |
| 2016/0049052 A1 | 2/2016 | Cheatham, III et al. | |
| 2017/0092281 A1* | 3/2017 | Zargar | G10L 25/84 |
| 2017/0140772 A1* | 5/2017 | Pak | G10L 21/0316 |
| 2017/0295439 A1* | 10/2017 | Xu | A61N 1/36036 |
| 2019/0348058 A1* | 11/2019 | Choo | G10L 21/0232 |

FOREIGN PATENT DOCUMENTS

| | | |
|---|---|---|
| WO | WO-03019125 | 3/2003 |
| WO | 2004077806 A1 | 9/2004 |
| WO | WO-2013058728 | 4/2013 |

* cited by examiner

1500

DETERMINE, BASED ON BACKGROUND NOISE AT A NEAR-END OF A SPEAKER, A NOISE ESTIMATE ASSOCIATED WITH SPEECH EMITTED FROM THE SPEAKER
1502

COMPARE, BY USING A SPECIFIED FACTOR, THE NOISE ESTIMATE TO A SPEECH LEVEL ESTIMATE FOR THE SPEECH EMITTED FROM THE SPEAKER
1504

DETERMINE, BY USING A CAMERA, A DISTANCE OF A TARGET LISTENER FROM THE SPEAKER
1506

DETERMINE, BASED ON THE COMPARISON AND THE DISTANCE OF THE TARGET LISTENER FROM THE SPEAKER, A GAIN VALUE TO BE APPLIED TO THE SPEAKER TO PRODUCE THE SPEECH AT A SPECIFIED LEVEL TO MAINTAIN ON-AXIS INTELLIGIBILITY WITH RESPECT TO THE SPEAKER
1508

APPLY THE GAIN VALUE TO THE SPEAKER
1510

FIG. 15

ADAPTIVE SPEECH INTELLIGIBILITY CONTROL FOR SPEECH PRIVACY

BACKGROUND

In voice communications environments, such as in an office, a home, a retail location, etc., a speaker or another such device may be used to listen to speech that is transmitted to the speaker. In such environments, speech privacy of the speech that is transmitted to the speaker may be desired beyond a specified listening area. Speech privacy may be described as the ability of an unintentional listener outside the specified listening area to understand the speech.

BRIEF DESCRIPTION OF DRAWINGS

Features of the present disclosure are illustrated by way of example and not limited in the following figure(s), in which like numerals indicate like elements, in which:

FIG. 15 illustrates a flowchart of a method for adaptive speech intelligibility control for speech privacy, according to an example of the present disclosure.

DETAILED DESCRIPTION

Figure 1:
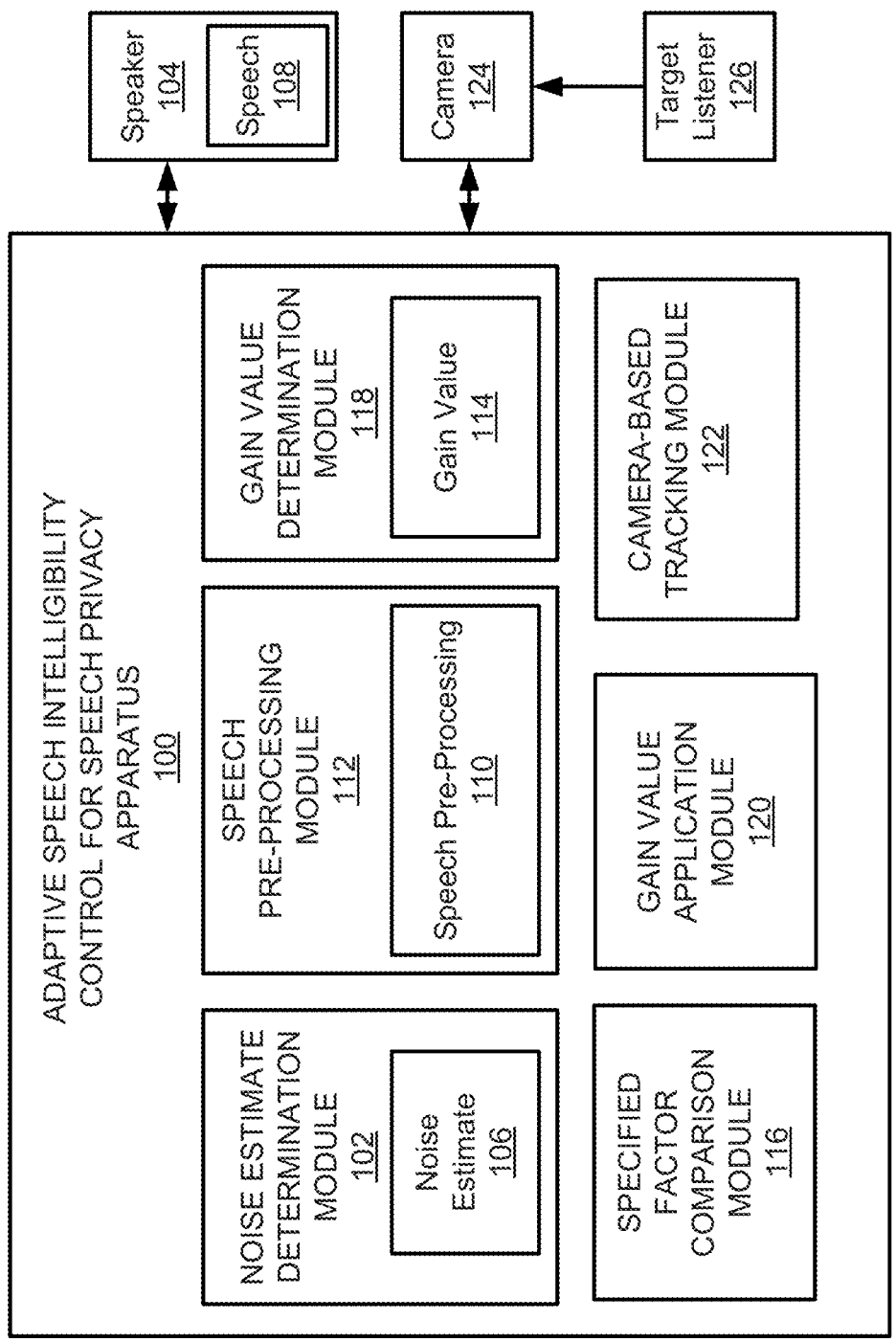
FIG. 1 illustrates a layout of an adaptive speech intelligibility control for speech privacy apparatus, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

An adaptive speech intelligibility control for speech privacy apparatus, a method for adaptive speech intelligibility control for speech privacy, and a non-transitory computer readable medium having stored thereon machine readable instructions to provide adaptive speech intelligibility control for speech privacy are disclosed herein. The apparatus, method, and non-transitory computer readable medium disclosed herein provide speech privacy based on perceptually derived speech processing using directional speakers. The apparatus, method, and non-transitory computer readable medium disclosed herein further include a camera to estimate a distance of a desired listening position (e.g., of a target listener), which may be in a far-field, and accordingly adapt the speech processing based on a near-field or far-field position of the target listener.

With respect to the apparatus, method, and non-transitory computer readable medium disclosed herein, Voice over Internet Protocol (VoIP) communication includes low-latency, low-delay, low packet-loss with robust packet-loss concealment techniques, low-jitter before packet transmission, high-quality speech coding, and high signal-to-noise ratio (SNR) speech-acquisition. In voice communications environments, such as in an office, a home, a retail location, etc., speech privacy may be desired to be maintained beyond a specified speech area (e.g., beyond a listening area of a target listener). For example, when listening with speakers such as external speakers, speech privacy may be desired to be maintained in an area beyond a specified listening area. Speech privacy impacts both the person to whom a conversation is directed towards from a privacy viewpoint, as well as an unintentional person who may be able to listen to the conversation from a security viewpoint.

According to examples, the apparatus, method, and non-transitory computer readable medium disclosed herein provide for speech privacy beyond a specified listening area by determining, based on background noise at a near-end of a speaker, a noise estimate associated with speech emitted from the speaker, and comparing, by using a specified factor, the noise estimate to a speech level estimate for the speech emitted from the speaker. Further, the apparatus, method, and non-transitory computer readable medium disclosed herein provide for speech privacy beyond a specified listening area by determining, based on the comparison, a gain value to be applied to the speaker to produce the speech at a specified level to maintain on-axis intelligibility with respect to the speaker, and applying the gain value to the speaker.

For the apparatus, method, and non-transitory computer readable medium disclosed herein, modules, as described herein, may be any combination of hardware and programming to implement the functionalities of the respective modules. In some examples described herein, the combinations of hardware and programming may be implemented in a number of different ways. For example, the programming for the modules may be processor executable instructions stored on a non-transitory machine-readable storage medium and the hardware for the modules may include a processing resource to execute those instructions. In these examples, a computing device implementing such modules may include the machine-readable storage medium storing the instructions and the processing resource to execute the instructions, or the machine-readable storage medium may be separately stored and accessible by the computing device and the processing resource. In some examples, some modules may be implemented in circuitry.

FIG. 1 illustrates a layout of an adaptive speech intelligibility control for speech privacy apparatus (hereinafter also referred to as "apparatus 100"), according to an example of the present disclosure.

Referring to FIG. 1, the apparatus 100 may include a noise estimate determination module 102 to determine, based on background noise at a near-end of a speaker 104, a noise estimate 106 associated with speech 108 emitted from the speaker 104. As disclosed herein with reference to FIG. 5, the speech pre-processing 110 may be performed by a speech pre-processing module 112, and is based on far-end speech level estimation of the speech 108 emitted from the speaker 104. Further, a modulated ultrasound level estimation may be generated based on the speech pre-processing 110 and a gain value 114 associated with the speaker 104.

A specified factor comparison module 116 may compare, by using a specified factor, the noise estimate 106 to a speech level estimate for the speech 108 emitted from the speaker 104. As disclosed herein with reference to FIGS. 3-5, according to an example, the specified factor may include a masking threshold, a speech intelligibility index, an articulation index, or a speech transmission index.

A gain value determination module 118 may determine, based on the comparison, the gain value 114 to be applied to the speaker 104 to produce the speech 108 at a specified level to maintain on-axis intelligibility with respect to the speaker 104.

A gain value application module 120 may apply the gain value 114 to the speaker 104.

A camera-based tracking module 122 may determine, by using a camera 124, a distance of a target listener 126 from the speaker 104. In this regard, the gain value determination module 118 may determine, based on the comparison and the distance of the target listener 126 from the speaker 104, the gain value 114 to be applied to the speaker 104 to produce the speech 108 at the specified level to maintain the on-axis intelligibility with respect to the speaker 104.

As will be appreciated, some examples of the apparatus 100 may be configured with more or less modules, where modules may be configured to perform more or less operations. Furthermore, in some examples, the modules may be implemented by execution of instructions with a processing resource to cause the processing resource to perform the corresponding operations.

The apparatus 100 may be implemented in speech-privacy applications in conjunction with a VoIP-based communication system (e.g., Skype™, and the like), with the speaker 104. According to an example, the speaker 104 may include a piezo-transducer, and an ultrasonic modulator for modulating inbound speech. The speech pre-processing module 112 may correct nonlinear distortion components generated by the piezo-transducer of the speaker 104. The piezo-transducer may produce ultrasonic frequency (e.g., where a carrier frequency is $\geq 40$ kHz), and receive a speech signal that is ultrasonically modulated by the ultrasonic modulator carrier frequency to generate a directional audio wavefront.

The directional audio wavefront may be demodulated due to nonlinear interaction of the ultrasonic wave, which may be transmitted at high power and high intensity in decibel sound pressure level (dBSPL), with air. The demodulated directional audio wavefront may be perceived by a hearing of the target listener 126 as baseband audio in the domain [x, y] kHz, where $x \geq 0.020$ and $y \leq 20$. According to an example, $x \approx 1$ and $y \approx 8$ for the speaker 104.

After demodulation of the directional audio wavefront, the directional audio wavefront along the path of propagation may be perceived to be narrow-band. This may affect the use-case for the speaker 104 for speech communication devices. Additionally, the directional audio wavefront may be further limited in amplitude to minimize nonlinear distortion artifacts at the output of the piezo-transducer arising from harmonically related signal components. At relatively higher audio signal levels, with low to none ambient noise levels, speech may be comprehensible off-axis, thus facilitating the understanding of conversation by an unintentional listener. Along the off-axis of the speaker 104, at relatively lower frequencies (e.g., close to 1 kHz), directivity in the baseband audio spectrum may reduce, thus contributing to speech comprehension. Furthermore, reflections from boundaries or reflecting surfaces within the vicinity of the speaker 104 may further reduce speech privacy, thus increasing comprehension off-axis by an unintentional listener.

The apparatus 100 provides for a relatively high speech level with acceptable speech intelligibility within at a specified listening area (e.g., at a specified listening position), and reasonably low speech intelligibility off-axis, under ambient noise conditions. With respect to speech intelligibility, intelligibility may be described as "speech clarity" or the proportion of a speaker's output that a listener may readily understand.

The speech intelligibility index (SII) may be described as a metric that may represent a signal-to-noise ratio (SNR) measure, and may be used to measure intelligibility. With respect to the speech intelligibility index, four measurement procedures using a different number and size of frequency bands may be used to model human hearing along the basilar membrane. In descending order of accuracy, the four measurement procedures may include measurements based on 21 bands, 18 bands, 17 bands, and 6 bands. The value of speech intelligibility index may vary from 0 (completely unintelligible) to 1 (perfect intelligibility). Speech intelligibility index may feature both wide bandwidth (e.g., 150 Hz to 8.5 kHz) and a relatively high resolution. The speech intelligibility index may include reverberation, noise, and distortion, all of which may be accounted for in a modulation transfer function. Additional metrics that may represent a signal-to-noise ratio (SNR) measure include the speech transmission index (STI), articulation index (AI), and masking thresholds.

With respect to a masking threshold, a low level speech signal may be rendered inaudible if there is a simultaneous occurrence of a stronger signal which is close in frequency to the low level speech signal. This phenomenon may be described as masking. The relatively stronger signal that masks the weaker signal may be designated the masker and the relatively weaker signal that is masked may be designated the maskee. The masking may be largest in the band in which the masker is located, and to a lesser degree, masking may also be effective in the neighboring bands. A masking threshold may be defined, below which the presence of any speech may be rendered inaudible. The masking threshold may depend upon the sound pressure level (SPL), the frequency of the masker, and the characteristics of the masker and the maskee, such as whether the masker is a tone or noise.

Figure 2:
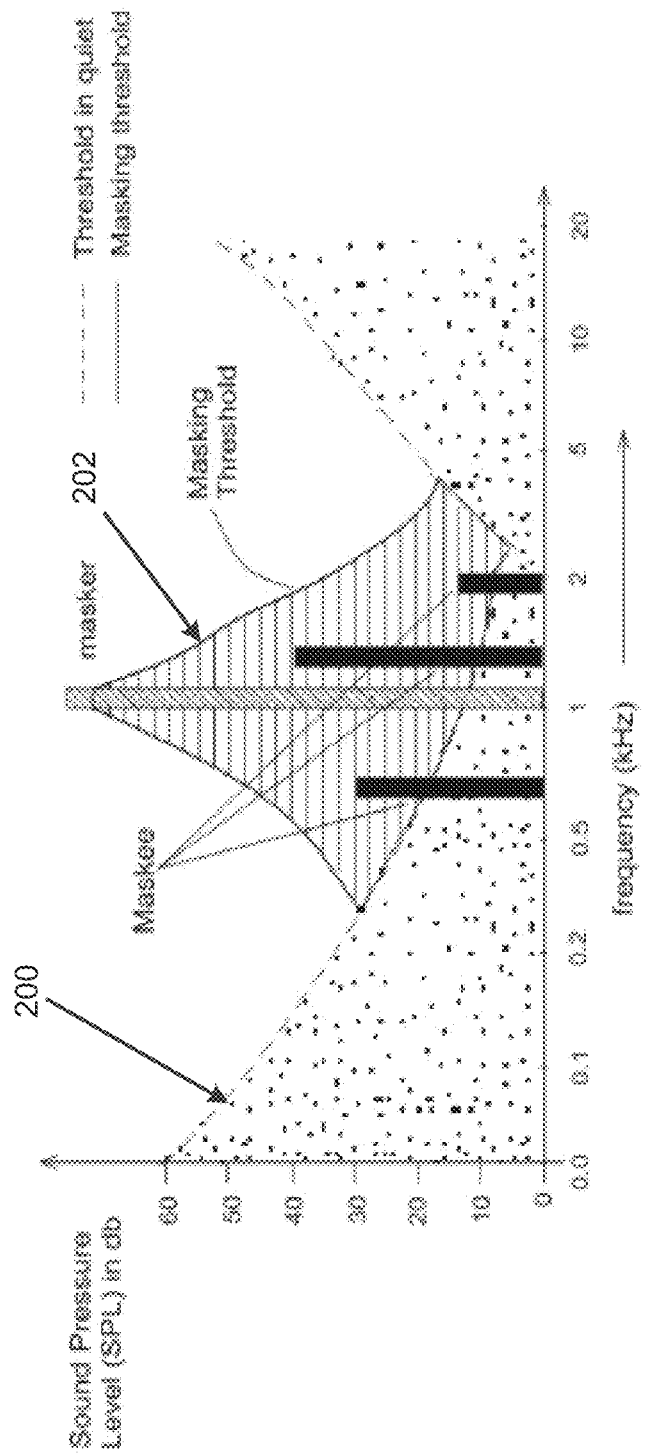
FIG. 2 illustrates masker and maskee (complex tones) for determining masking thresholds to illustrate operation of the adaptive speech intelligibility control for speech privacy apparatus of FIG. 1, according to an example of the present disclosure.

FIG. 2 illustrates simultaneous masking including masker and maskee (complex tones) for determining masking thresholds for the apparatus 100, according to an example of the present disclosure. Additionally, temporal masking may be incorporated into the design. Referring to FIG. 2, the threshold in quiet is illustrated at 200, and the masking threshold is illustrated at 202. Maskee's are shown as below the masking threshold is illustrated at 202. A release-from-masking (RM) curve may be derived by analyzing the relative difference in level between the masker (e.g., noise in a specific band), the maskee (speech in the corresponding band), and the threshold of audibility for the same band. Accordingly, a gain curve may correspond, in one example, to the RM curve.

Figure 3:
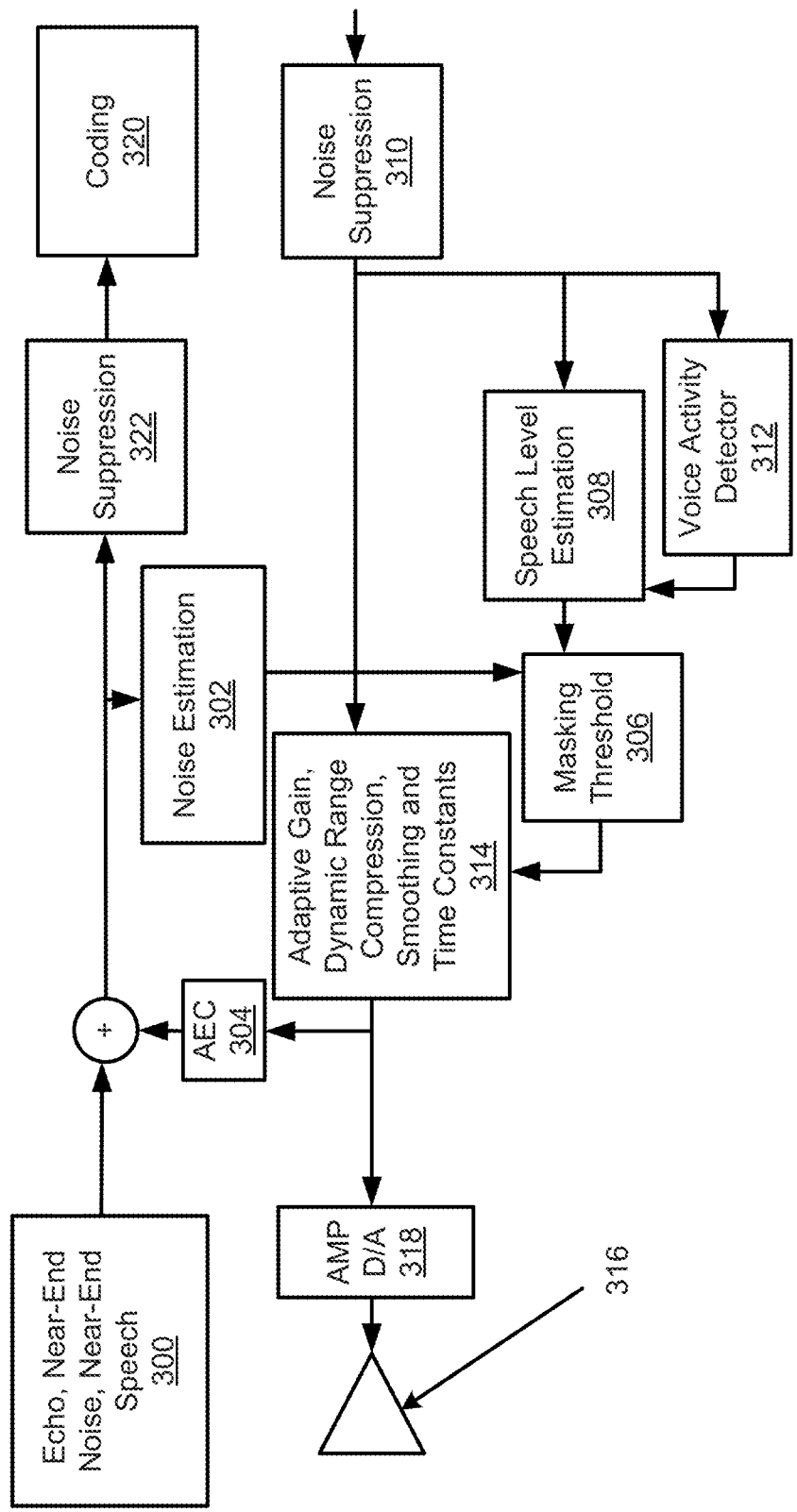
FIG. 3 illustrates speech processing for adaptive control for speech privacy with masking thresholds for the adaptive speech intelligibility control for speech privacy apparatus of FIG. 1, according to an example of the present disclosure.
Figure 4:
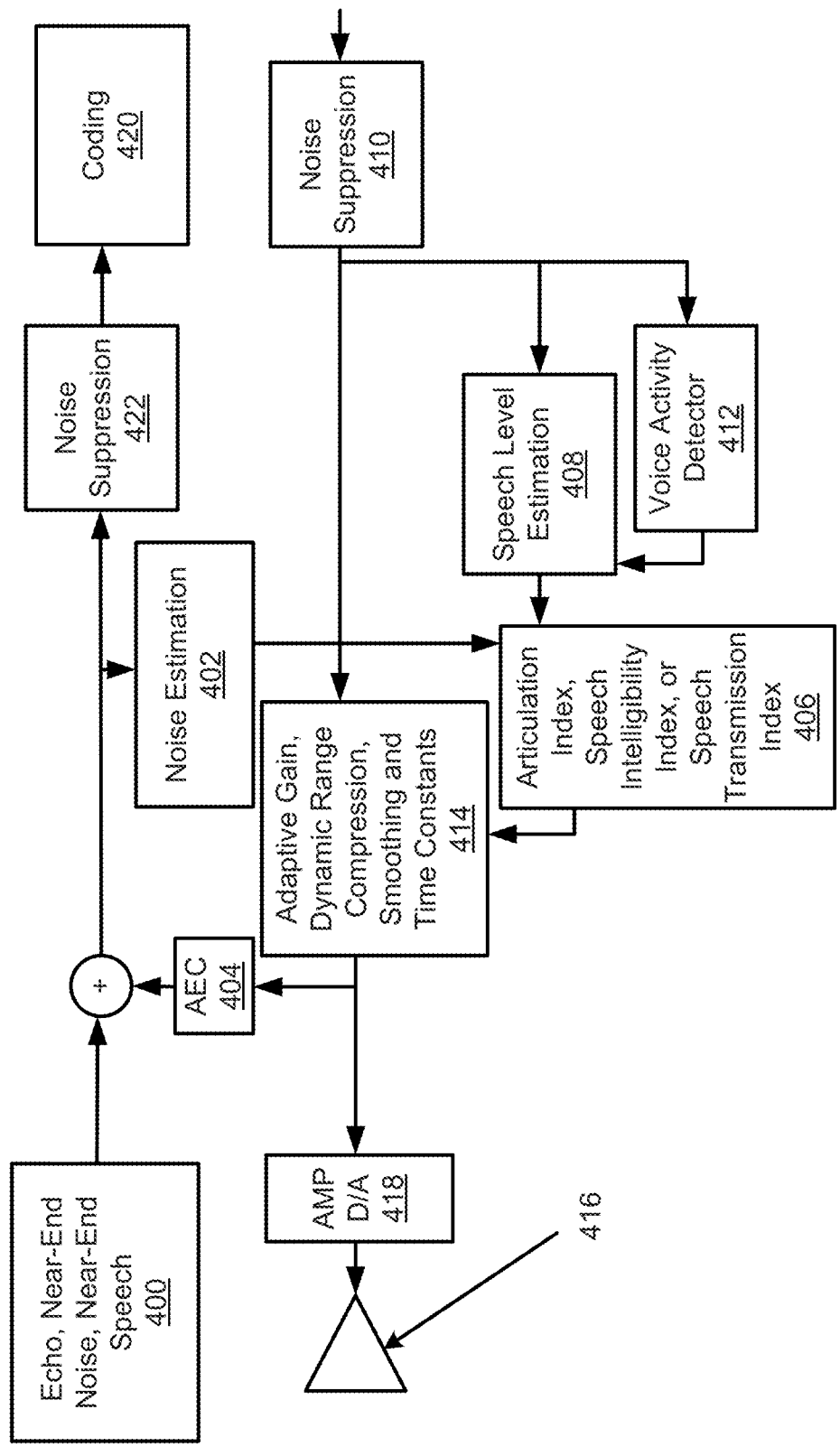
FIG. 4 illustrates speech processing for adaptive control for speech privacy with speech intelligibility index (SII), articulation index (AI), speech transmission index (STI) for the adaptive speech intelligibility control for speech privacy apparatus of FIG. 1, according to an example of the present disclosure.
Figure 5:
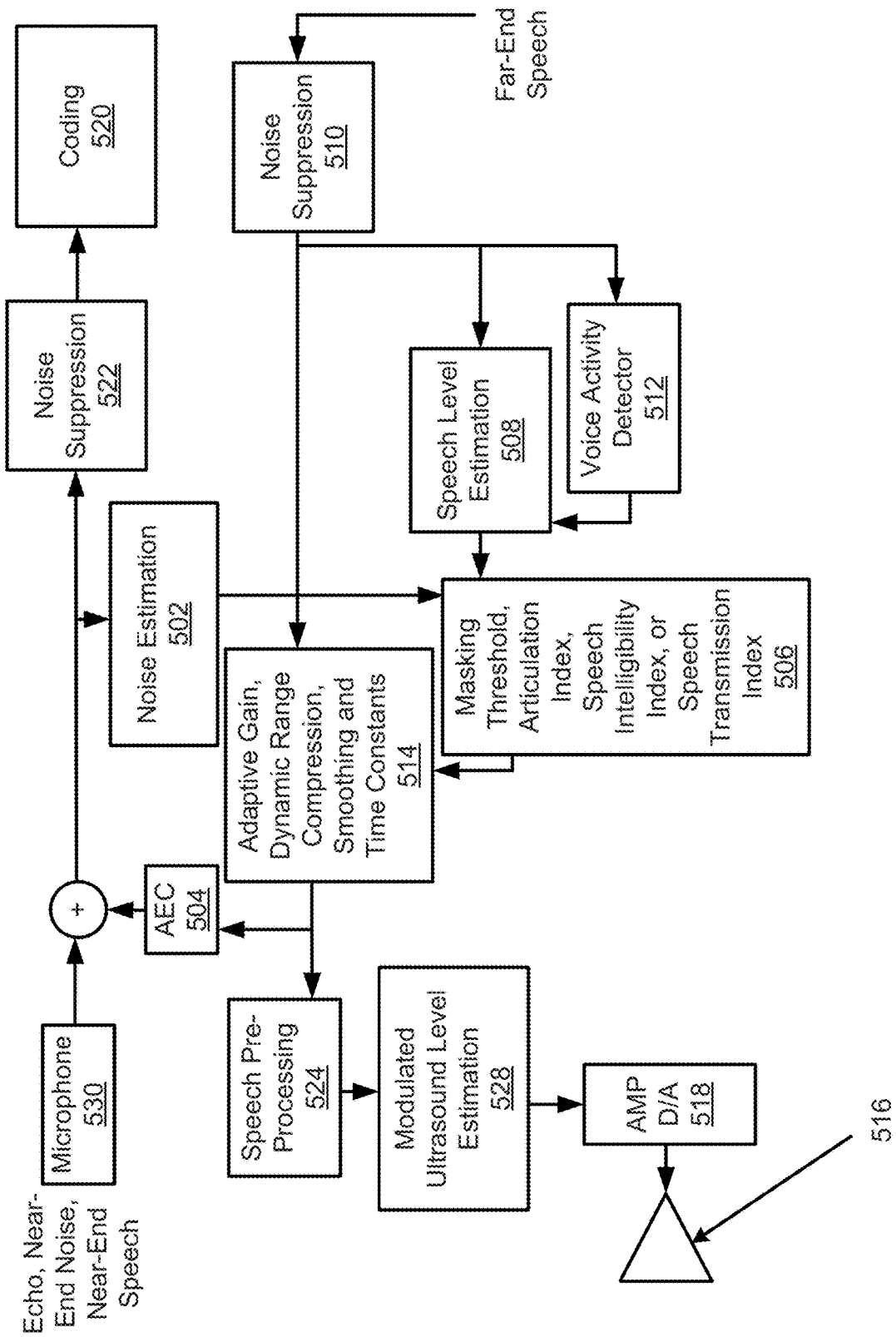
FIG. 5 illustrates speech processing for adaptive control for speech privacy and input pre-processing for the adaptive speech intelligibility control for speech privacy apparatus of FIG. 1, according to an example of the present disclosure.

FIGS. 3-5 illustrate approaches for controlling speech privacy in the presence of ambient noise with arbitrary signal-to-noise ratio. Specifically, FIG. 3 illustrates speech processing for adaptive control for speech privacy with masking thresholds for the apparatus 100, according to an example of the present disclosure. FIG. 4 illustrates speech processing for adaptive control for speech privacy with speech intelligibility index (SII), articulation index (AI), or speech transmission index (STI) for the apparatus 100, according to an example of the present disclosure. Further, FIG. 5 illustrates speech processing for adaptive control for speech privacy and input pre-processing for the apparatus 100, according to an example of the present disclosure.

With respect to FIGS. 3-5, controlling speech privacy in the presence of arbitrary signal-to-noise ratio ambient noise may include metering background noise, in the near-end, during the first few milliseconds at the beginning of a call (e.g., a Skype™ call), and then continuously updating a noise estimate, while ensuring near-end speech is not used in computing noise estimate. For example, referring to FIG. 3, at block 300, controlling speech privacy in the presence of arbitrary signal-to-noise ratio ambient noise may include metering background noise, in the near-end. The near-end background noise may be ascertained by a microphone, such as microphone 530 of FIG. 5, and its level in dBA/dBC may be estimated accordingly. At block 302, the noise estimate may be continuously updated while ensuring near-end speech is not used in determining the noise estimate at block 302 (e.g., see also block 1306 of FIG. 13). With respect to the acoustic echo cancellation (AEC) block 304, an echo-canceller may subtract out reflected far-end speech, and the noise estimate may be determined as the residual if there is no near-end speech. If there is near-end speech, a voice activity detector (VAD) may be used to identify near-end speech portions, and non-speech and noise portions to derive a noise-estimator. The near-end speech may be ascertained by a microphone, such as microphone 530 of FIG. 5. Alternatively, if a microphone array is used as disclosed herein with reference to FIG. 12, the speech direction may be used to estimate the near-end speech as disclosed herein with reference to FIG. 13.

The output from the noise estimate at block 302 may be forwarded to a thresholding block 306 (illustrated as masking threshold 306). The noise estimate at block 302 may include a root mean square (RMS) level determined over a frame of data from wide-band spectrum. Alternatively, the noise estimate at block 302 may be derived from sub-band processing per the speech intelligibility index standard.

The masking threshold at block 306 may compare the noise estimate from block 302 with far-end speech level estimate from block 308, in a similar manner as disclosed herein with respect to FIG. 2.

The far-end speech level estimate from block 308 may be determined using wide-band or via analysis in sub-band. This provides for application of an overall constant gain or a frequency dependent gain in case of sub-band processing.

The far-end speech level estimate at block 308 may be determined as a function of noise suppression at block 310 and voice-activity detection at block 312, in a similar manner as disclosed herein with respect to near-end analysis. The noise suppression at block 310 may cancel far-end noise for a near-end user.

The output from the comparison at block 306 may be applied to a wide-band gain control, a dynamic range compression, or a smoothing and time constants block 314 to ensure far-end speech is reproduced during playback at a level just sufficient to maintain intelligibility on-axis. With respect to wide-band gain control, the function $G(f)*x(f)$ may be utilized, where x is speech in a frame, and $G(dB,f)$ $=RM(f)+epsilon$, where epsilon is a nominal value such as 0.5 dB that produces a just-noticeable difference, and f is a frequency bin value. Given that the speaker 316 (i.e., ultrasonic emitter) is directional, this will ensure that intelligibility (and hence comprehension) of speech is low in the off-axis.

The block 318 may include modulation and amplification. The modulation modulates the far-end speech with an ultrasonic carrier before amplification. A digital to analog (D/A) converter at block 318 may convert the digital signal from block 310 to an analog signal for the speaker 316.

The output from blocks 300 and 304 may also be used for coding at block 320. Examples of coding may include speech coders such as Moving Picture Experts Group (MPEG), Unified Speech and Audio Coding (USAC), Adaptive Multi-Rate Wideband (AMR-WB), etc. The coding at block 320 may be subject to noise suppression at block 322 which cancels near-end noise for a far-end user as disclosed herein with reference of FIGS. 12 and 13.

Referring to FIG. 4, blocks 400-404, 408-414, and 418-422 include similar functionality compared to blocks 300-304, 308-314, and 318-322 of FIG. 3. With respect to block 406, the output from the noise estimate at block 402 may be delivered to block 406, which may include a speech intelligibility index, an articulation index, or a speech transmission index. The speech intelligibility index may represent a measure, for example, between 0 and 1, which represents the intelligibility of speech under a variety of adverse listening conditions, such as noise masking, filtering, and reverberation, etc. The articulation index may be described as a tool used to predict the amount of speech that is audible to a user with a specific hearing loss. The articulation index figure for a given user may range from 0 to 1, representing the proportion of the average speech signal that is audible. The speech transmission index may be described as a measure of speech transmission quality. The speech transmission index may measure some physical characteristics of a transmission channel (e.g., a room, electro-acoustic equipment, telephone line, etc.), and express the ability of the channel to carry across the characteristics of a speech signal. The speech intelligibility index, the articulation index, or the speech transmission index at block 406 may be specified with or without noise suppression. Block 406 may compare the noise estimate from block 402 with the far-end speech level estimate from block 408. Block 408 may suppress the far-end noise to determine cleaner far end speech before the speech is marked by near-end noise.

The output from the comparison at block 406 may be applied to a wide-band gain control or a dynamic range compression block 414 to ensure far-end speech is reproduced during playback at a level just sufficient to maintain intelligibility on-axis. Given that the speaker 416 is directional, this will ensure that intelligibility (and hence comprehension) of speech is low in the off-axis.

Referring to FIG. 5, blocks 502-504, 508-514, and 518-522 include similar functionality compared to blocks 302-304, 308-314, and 318-322 of FIG. 3. The noise estimation at block 502 may be determined as a function of near-end noise at microphone 530. For example, the noise estimate at block 502 may be obtained from block 1306 of FIG. 13 as disclosed herein.

The speech pre-processing at block 524 may receive input from block 514, and a modulated ultrasound level estimation at block 528 may be determined based on a non-linear acoustic model. An ultrasound transducer may generate acoustic waves in a medium such as air. When the ultrasound intensity increases, a single frequency ultrasound wave may generate harmonics due to the medium nonlinearity. When two ultrasonic signals of different frequencies emit from the ultrasonic transducer, the medium nonlinearity results in acoustic signals of sum and difference frequencies, in addition to the original frequencies and harmonics.

A parametric audio reproduction system utilizes the aforementioned nonlinear process to produce difference tones, for example, within a 20 HZ to 20,000 HZ hearing range of humans. An audio signal may be modulated onto an ultrasonic carrier. The modulated ultrasound waves may be amplified and emitted by an ultrasound transducer. The air nonlinearity may demodulate the ultrasound waves to reproduce the audio signals. However, distortion may be caused by various harmonics and other audio artifacts that are inherent in the parametric reproduction, and thus the demodulated audio may not recover the original audio.

With respect to distortion in parametric reproduction processes, distortion may be corrected by pre-processing the audio signal before it is modulated onto an ultrasound carrier. An air non-linear model (i.e., the non-linear acoustic model) may be defined to represent the ultrasound wave propagation model. Once this function is defined, an inverse function may be derived and used for audio pre-processing. This inverse function may condition the input audio signal so that when the input audio signal is fed into the nonlinear system, the original input signal (before conditioning) is recovered in the output with reduced distortions.

With respect to block 506, the output from the noise estimate at block 502 may be delivered to block 506, which may include a masking threshold (similar to block 306), or a speech intelligibility index, an articulation index, or a speech transmission index (similar to block 406). Block 506 may compare the noise estimate from block 502 with far-end speech level estimate from block 508. The output from the comparison at block 506 may be applied to a wide-band gain control or a dynamic range compression block 514 to ensure far-end speech is reproduced during playback at a level just sufficient to maintain intelligibility on-axis. Given that the speaker 516 is directional, this will ensure that intelligibility (and hence comprehension) of speech is low in the off-axis.

In order to further increase the accuracy of the analysis performed with respect to FIGS. 3-5, a target listener's distance may be estimated to adjust gain/compression settings at blocks 314, 414, and 514, respectively. For example, with respect to the target listener's distance, the farther the target listener, the higher the gain, which in a dynamic range compression means a higher compression ratio, and a reduced threshold with respect to dynamic range compression parameters. For example, a distance of the target listener 126 may be determined relative to a position of the speaker 516 to maintain acceptable speech privacy. In this regard, the camera 124 as disclosed herein with reference to FIG. 6 may be positioned at a fixed and calibrated distance relative to the speaker 104. For example, in the case of a personal computer type device, the camera may be positioned at a fixed and calibrated distance relative to the speaker 104 (e.g., where the camera 124 is mounted to a screen of the personal computer, and the speaker 104 is installed as a component of the personal computer). Alternatively, as disclosed herein with reference to FIGS. 7-11B, the camera may be positioned at an arbitrary position relative to the speaker 104, in which case the camera may identify both the target listener 126 and the speaker 104 to estimate the distance to the target listener 126.

A first technique of determining the distance to the target listener 126 using the camera-based detection includes computer vision based person detection for adapting speech processing for privacy. In this regard, FIG. 6 illustrates computer vision based person detection for adapting speech processing for privacy for the apparatus 100, according to an example of the present disclosure.

Figure 6:
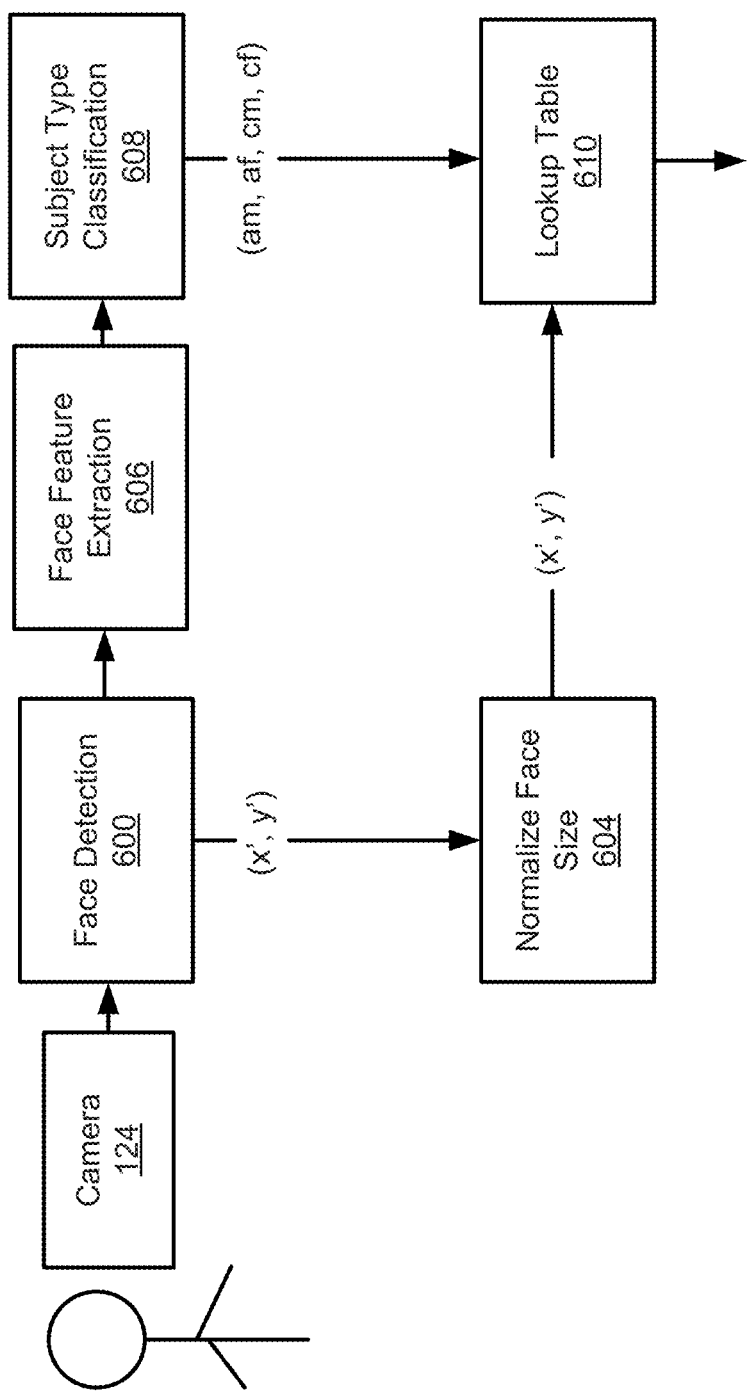
FIG. 6 illustrates computer vision based person detection for adapting speech processing for privacy for the adaptive speech intelligibility control for speech privacy apparatus of FIG. 1, according to an example of the present disclosure.

Referring to FIG. 6, with respect to camera-based tracking with speech privacy processing by the camera-based tracking module 122, computer vision based distance estimation may be separated into a measurement phase and an application phase.

During the measurement phase, a reference camera (not shown, or the camera 124), and camera capture system with characteristics such as lens distortion, resolution, height of the capture system may be setup. These camera capture system characteristics may be captured in a first lookup table (LUT 1). This reference setup may be used to measure the size of faces of each of the following subject types: (a) adult male denoted as am, (b) adult female denoted as af, (c) child male denoted as cm, and (d) child female denoted as cf. Additional subject types may be employed to increase accuracy. For each of the subject types, face size may be measured, for example, by the size of a bounding box around a detected face, with x and y pixels being recorded. The x and y pixels may represent the number of horizontal and vertical pixels of the bounding box, indicating the size of the face detected to the corresponding distance. The measurements of face size for each of the subject types may be conducted at different distances. The measured values may be stored along with subject type (e.g., am, af, cm, or cf). A second lookup table (LUT 2) may include entries such as subject type, distance, x pixels, and y pixels. Once the measurement phase is completed, the measured values may be applied to different types of camera systems.

With respect to the application phase, referring to FIG. 6, at block 600, a first step in estimating the distance of a person (e.g., the target listener 126) in front the camera 124 may include face detection. The size of the person's face may be measured, for example, by applying a bounding box around the face, with respect to pixel values x, y. As the actual camera system for the camera 600 and capture characteristics may differ from the reference camera and capture system, the aforementioned pixel values may be normalized. In this regard, the present camera system and characteristics, as well as values from LUT 1 may be used to generate the normalized pixel values x, y at block 604. With respect to the normalized pixel values x, y at block 604, cameras may include different lenses and sensors, and as a result, persons and objects may be recorded differently with respect to horizontal and vertical pixels. For example, a face may look smaller in a wide angle camera versus a telephoto camera. As it may not be possible to fix the camera size with respect to the camera used during the measurement phase, the size observed during the application phase may need to be normalized with respect to the normalized camera. These horizontal and vertical pixels may be represented as x' and y' as shown in FIG. 6. The detected face may be analyzed at block 606 to extract facial features to classify the face into one of four subject types (e.g., am, af, cm, or cf) at block 608. The normalized pixel values at block 604 and the subject type from block 608 may be used as indices to determine the estimated distance value from LUT 2 at block 610.

Figure 7:
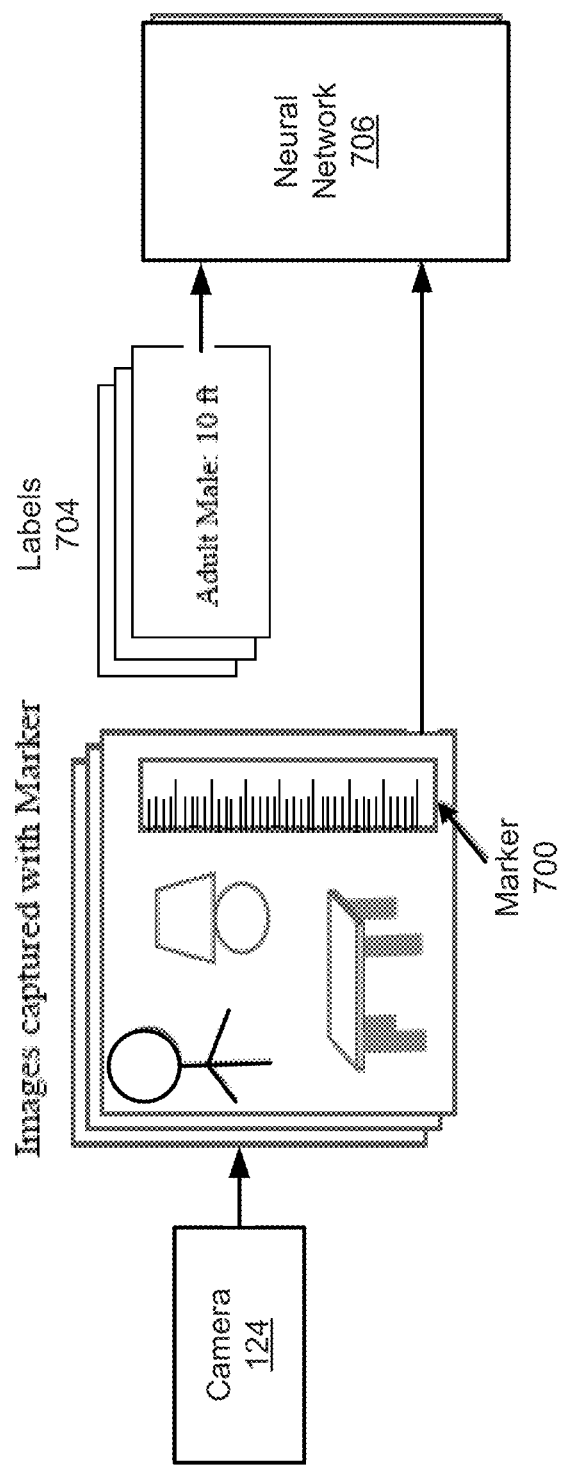
FIG. 7 illustrates a marker-based learning system during training for the adaptive speech intelligibility control for speech privacy apparatus of FIG. 1, according to an example of the present disclosure.

FIG. 7 illustrates a marker-based learning system during training for the apparatus 100, according to an example of the present disclosure.

Referring to FIG. 7, with respect to camera-based tracking with speech privacy processing by the camera-based tracking module 122, marker based learning for range estimation may be used to complement the computer vision based person detection technique of FIG. 6 to extend to non-persons. For example, with respect to a remote camera not at a fixed and calibrated position relative to the speaker 104, a learning approach with a reference marker may be implemented by the camera-based tracking module 122. The learning technique may include a training phase followed by an application phase.

FIG. 7 illustrates a marker-based learning system where the images for training may be captured with a marker 700. The marker 700 may be positioned at a fixed distance and at a fixed orientation relative to the camera 124. For the marker-based learning system, labels 704 describing objects and distance values may be generated for each corresponding image captured by the camera 124. The marker 700 may provide a reference to the size of various objects at different distances. The labels 704 and images captured with the marker 700 may be received by a neural network 706. The neural network 706 may learn the size of objects or persons with respect to distance. For example, the neural network 706 may be trained on hundreds of images of a person standing 10 ft from a camera, or 5 ft from a camera, etc. The trained neural network during the application phase may determine the distance at which a person is from the camera on any subsequent new images to classify new images. The neural network may include a deep neural network. The neural network 706 may include weights, and predict outputs. If the predicted output differs from the actual output, an error may be generated. The error may be back propagated to the neural network 706, and the weights may be adjusted accordingly. These iterations may be repeated until the error is minimized. The resulting neural network may be designated as a trained neural network, and the weights may be used during the application phase to classify distance values.

Figure 8:
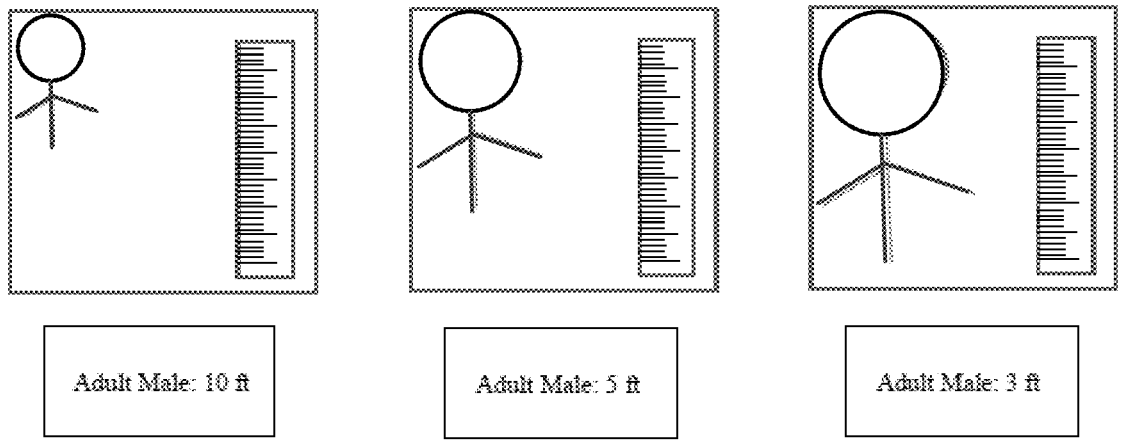
FIG. 8 illustrates examples of people at different distances captured by a camera for the adaptive speech intelligibility control for speech privacy apparatus of FIG. 1, according to an example of the present disclosure.

FIG. 8 illustrates examples of people at different distances captured by a camera for the apparatus 100, according to an example of the present disclosure. With respect to FIG. 8, diverse objects may be used for training. For example, objects such as an adult male may be captured at a distance of 10 feet, 5 feet, and 3 feet, as shown in FIG. 8.

Figure 9:
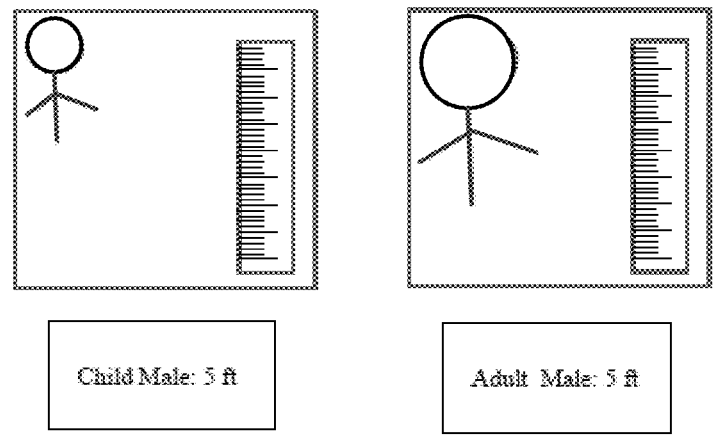
FIG. 9 illustrates examples of size differences between two people at the same distance for the adaptive speech intelligibility control for speech privacy apparatus of FIG. 1, according to an example of the present disclosure.

FIG. 9 illustrates examples of size differences between two people at same distance for the apparatus 100, according to an example of the present disclosure. For example, FIG. 9 shows size differences for a child male and an adult male at 5 feet. During the application phase, the same marker may be needed at the same distance and orientation as in the training system. In this regard, the camera 124 may capture the subjects, and the output image may be normalized with respect to the reference capture system.

Figure 10:
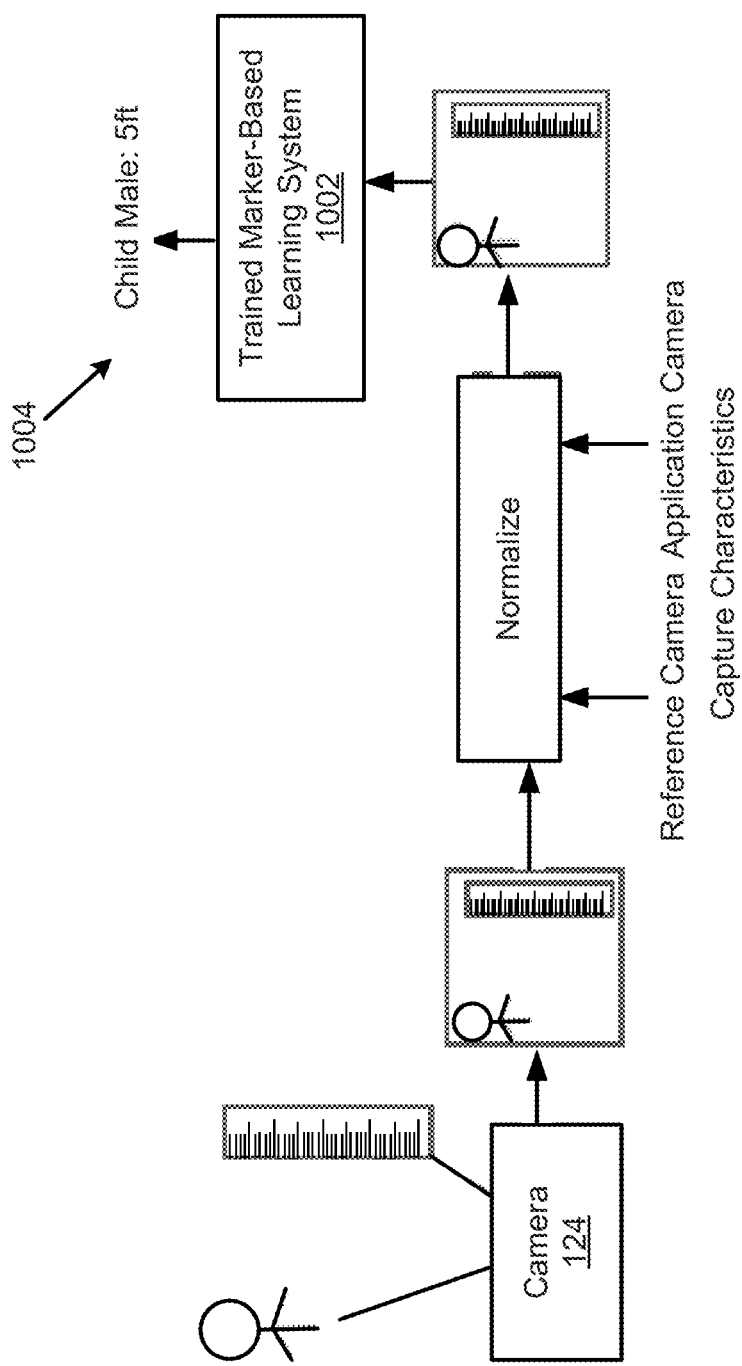
FIG. 10 illustrates the trained marker-based learning system of FIG. 7 during application for the adaptive speech intelligibility control for speech privacy apparatus of FIG. 1, according to an example of the present disclosure.
Figure 11:
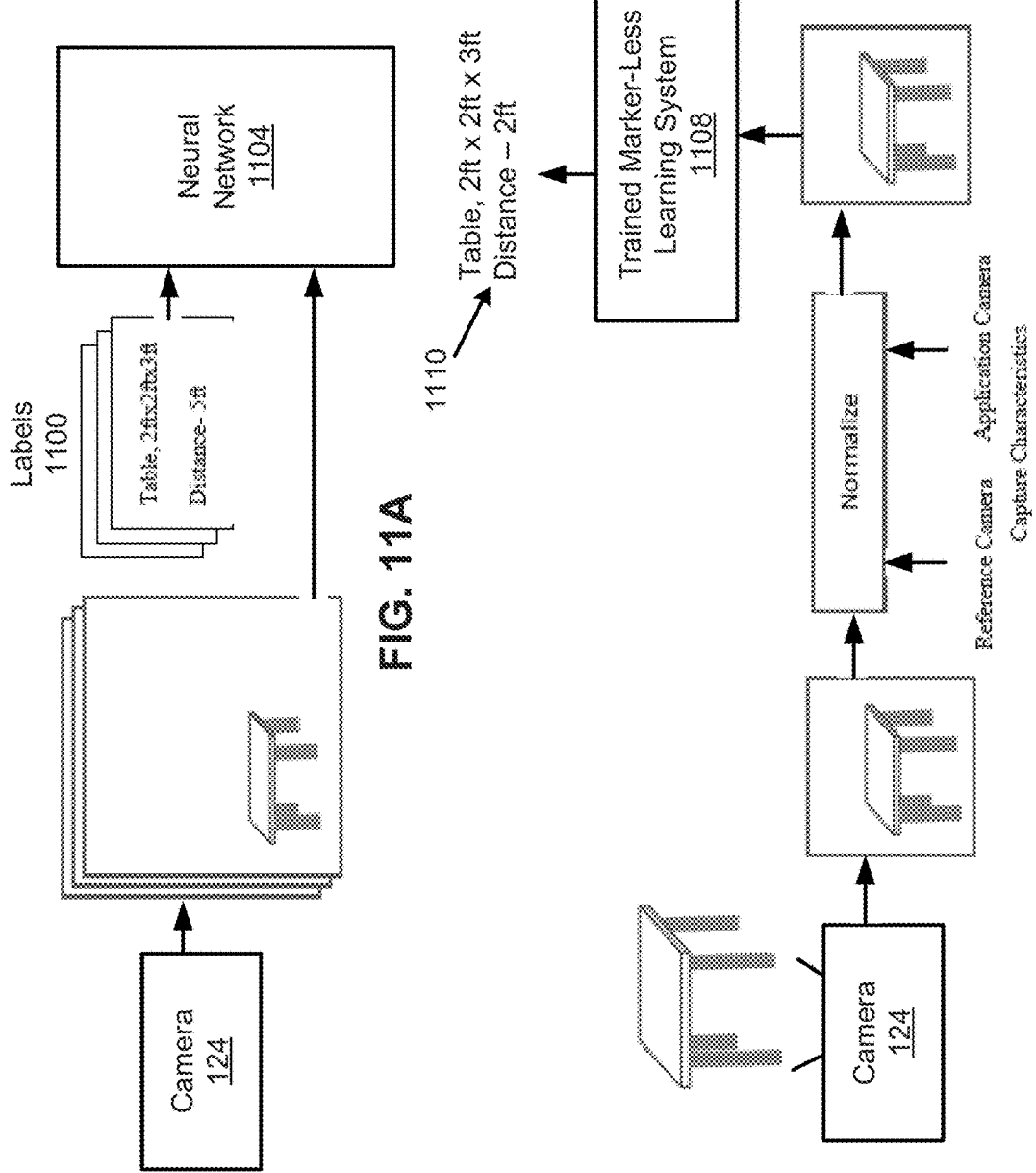
FIG. 11A illustrates a marker-less learning system during training.
FIG. 11B illustrates the trained marker-less learning system of FIG. 11A during application for the adaptive speech intelligibility control for speech privacy apparatus of FIG. 1, according to an example of the present disclosure.

FIG. 10 illustrates the marker-based learning system of FIG. 7 during application for the apparatus 100, according to an example of the present disclosure. With respect to FIG. 10, the image captured by the camera 124 may be fed into a trained marker-based learning system 1002, which classifies the image and outputs the estimated distance as shown at 1004.

FIG. 11A illustrates a marker-less learning system during training, and FIG. 11B illustrates the trained marker-less learning system of FIG. 11A during application for the apparatus 100, according to an example of the present disclosure.

Referring to FIG. 11A, with respect to marker-less learning for range estimation by the camera-based tracking module 122, the marker-less learning system for range estimation may be implemented by the apparatus 100 as an extension of the marker-based learning system of FIG. 7. Compared to the marker-based learning system of FIG. 7, the marker 700 from FIG. 7 may be removed for the marker-less learning system. For the marker-less learning system of FIG. 11A, range may be determined using existing objects within images based on absolute sizes and distance. The marker-less learning system may be trained with a diverse set of labeled images. For example, labels 1100 describing objects and distance values may be generated for each corresponding image captured by the camera 124. The labels 1100 and images captured by the camera 124 may be received by a neural network 1104. The neural network 1104 may be trained with objects with labels, such that during the application phase when images with these objects are presented to the neural network 1104, the neural network 1104 may estimate the distance with respect to the camera 124.

Referring to FIG. 11B, during an application phase, the process is similar to the marker-based learning system for range estimation. Distance estimation may be performed by a trained marker-less learning system, when an image is fed to the trained marker-less learning system and includes an object that the trained marker-less learning system has been trained with. With respect to FIG. 11B, the image captured by the camera 124 may be fed into a trained marker-less learning system 1108, which classifies the image and outputs the estimated distance as shown at 1110.

The marker-based and marker-less techniques of FIGS. 7-11B may also be utilized with videos. For example, an application that includes speech privacy may utilize orientation in three-dimensional (3D) space of an object. In this case, the orientation of the object may be inferred from the distance combined with the x, y position of the object within the image.

Figure 12:
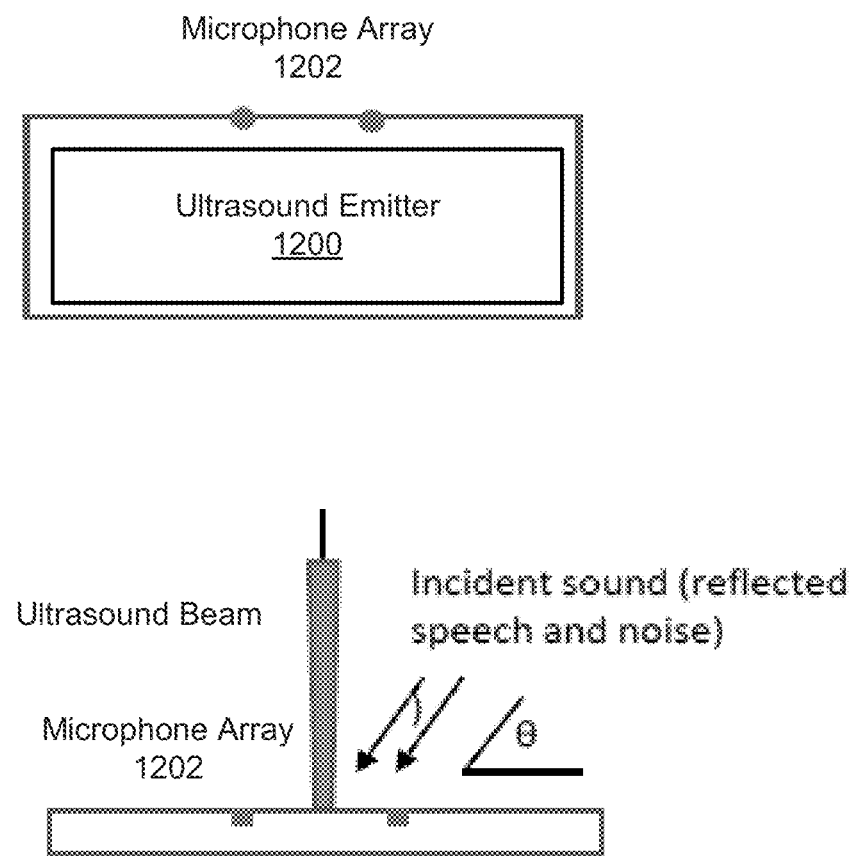
FIG. 12 illustrates a microphone-array input for the adaptive speech intelligibility control for speech privacy apparatus of FIG. 1, according to an example of the present disclosure.

FIG. 12 illustrates a microphone-array input to the apparatus 100, according to an example of the present disclosure.

With respect to pre-processing combined with speech privacy, the speech pre-processing module 112 may perform far-end speech pre-processing, noise-suppression, and acoustic echo cancellation (AEC), etc. For example, as shown in FIG. 12, an ultrasound emitter 1200 and an array of microphones (designated microphone array 1202) may be arranged as shown in FIG. 12. The microphone array 1202 may include two or more microphones. The spacing d between microphones may be less than the smallest wavelength of interest frequency, i.e., kd≤1, where k=2π/λ is the wave number. The sound (speech and noise) at the microphone array 1202 may be digitized by an analog to digital converter. The time of arrival may be used to calculate the incoming sound direction. For example, if the sound is incoming in a vertical direction, the sound will reach both microphones of the microphone array 1202 at the same time. If the sound is incoming from the right to left direction in the orientation of FIG. 12, the sound will reach the right side microphone of the microphone array 1202 first, and then the left side microphone of the microphone array 1202. According to an example, the incoming sound direction of θ=90° may be used as a reference sound and noise, and sound from other directions may be used as a reference noise. In this manner, near-end noise may be canceled before it is transmitted to the far end. An adaptive technique such as least mean squares may be used for noise cancellation. The noise cancellation may cancel the near-end noise before the near-end noise is transmitted to the far end.

Figure 13:
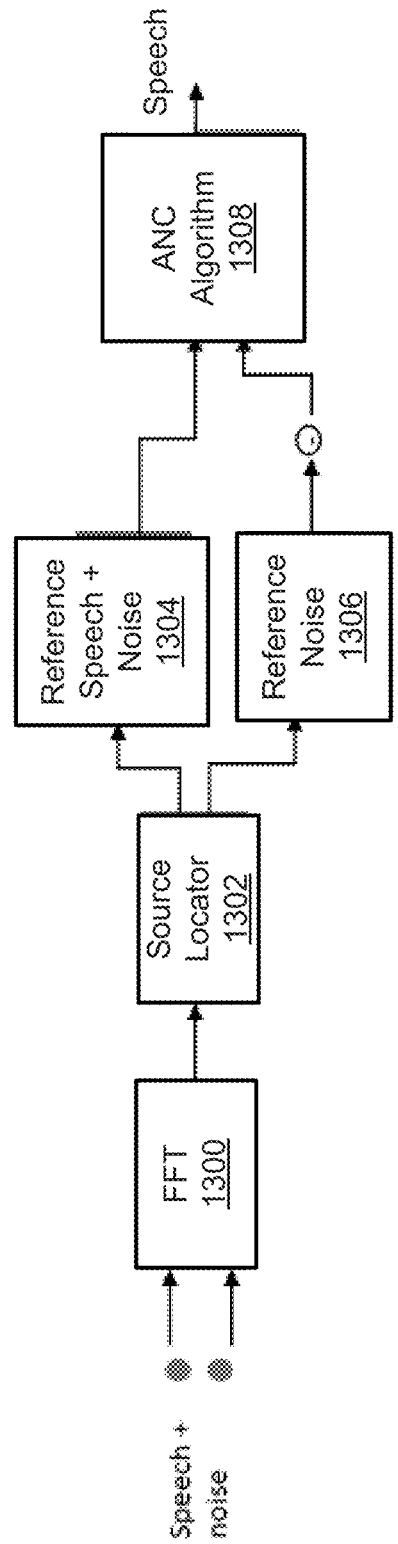
FIG. 13 illustrates active noise cancellation with a microphone-array for the adaptive speech intelligibility control for speech privacy apparatus of FIG. 1, according to an example of the present disclosure.

FIG. 13 illustrates an active noise cancellation with microphone-array for the apparatus 100, according to an example of the present disclosure.

At block 1300, a fast Fourier transform (FFT) may be applied to incoming speech and noise, and the results from block 1300 may be received by a source locator at block 1302. According to an example, a near-end user may face the center of the ultrasound emitter 1200 while talking to the microphone array 1202 directly, thus the incoming sound direction of θ=90° may be used as a reference sound and noise at block 1304, and sound from other directions may be used as a reference noise at block 1306. An adaptive algorithm such as least mean squares may be used at block 1308 for noise cancellation to generate speech.

For the apparatus 100, with respect to hardware of the speaker 104, the speaker 104 may include grills which function as wave guides. In this regard, the grills may include specific mechanics and physical anatomy to disperse and/or block ultrasonic waves, increase and/or decrease sound level, and channel, focus, funnel, direct and/or steer ultrasonic signals to a desired listening location of the target listener 126. The speaker grills may be accessorized and pre-conditioned for specific use cases and desired user experience.

Figure 14:
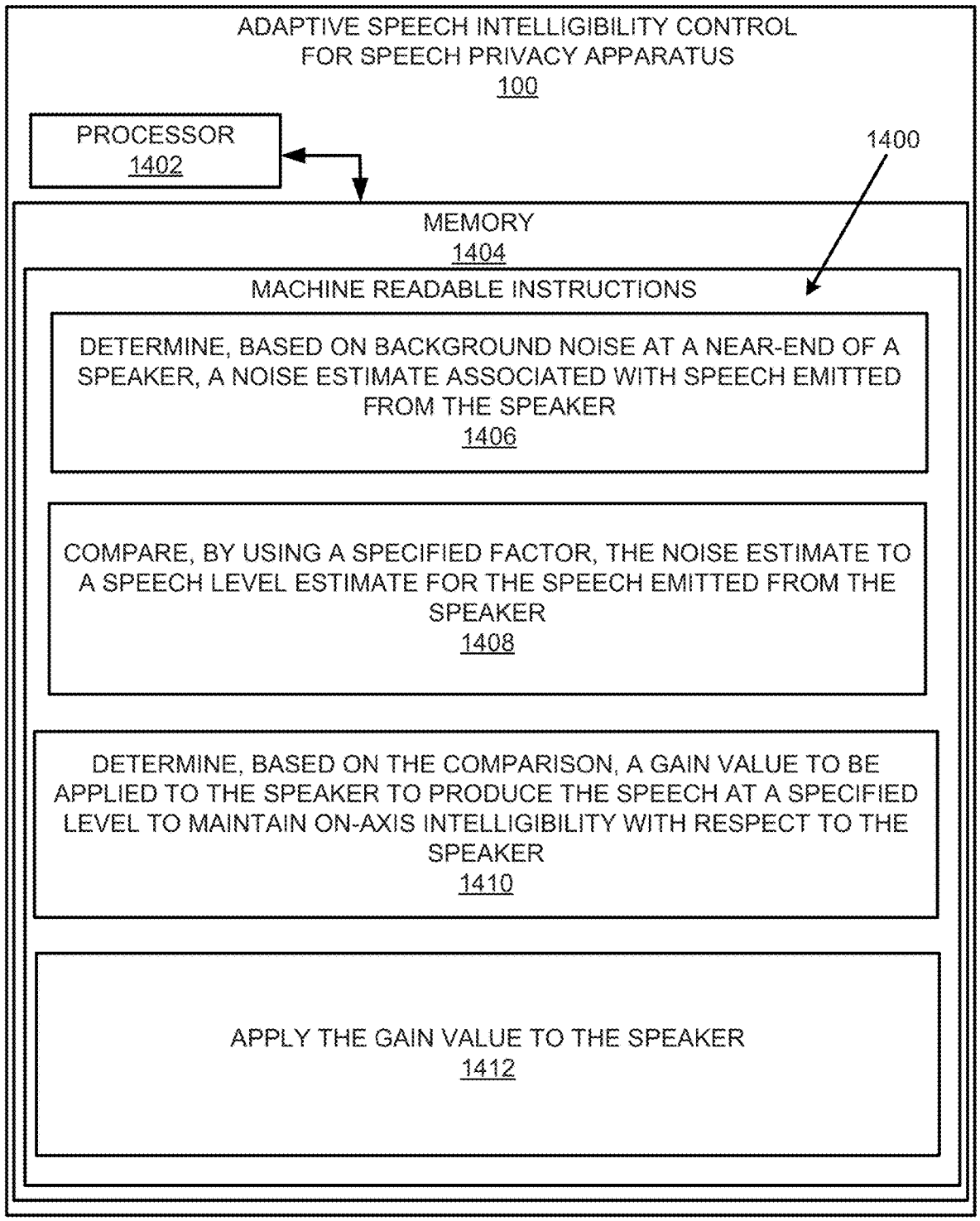
FIG. 14 illustrates a block diagram for adaptive speech intelligibility control for speech privacy, according to an example of the present disclosure.
Figure 16:
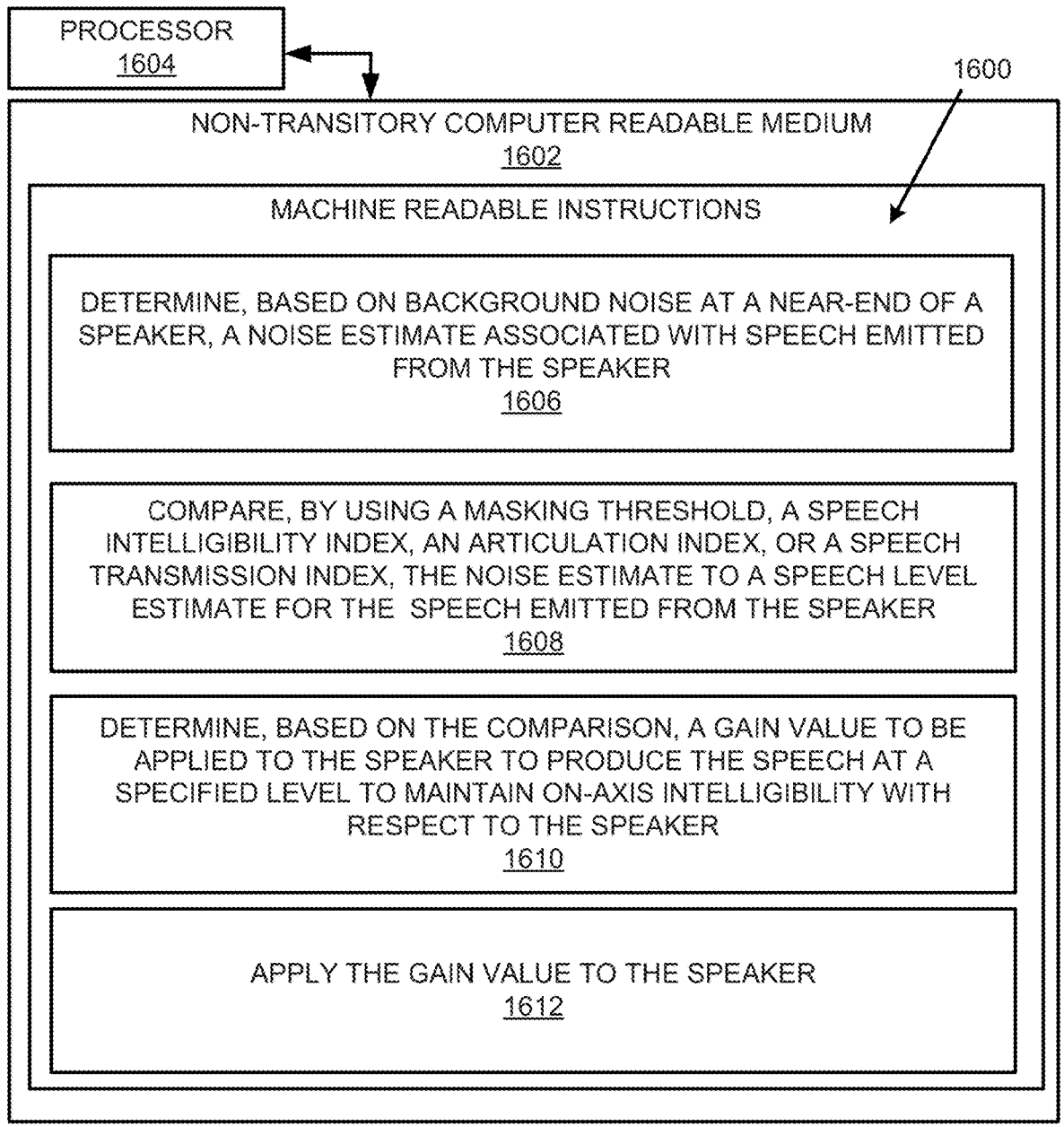
FIG. 16 illustrates a further block diagram for adaptive speech intelligibility control for speech privacy, according to an example of the present disclosure.

FIGS. 14-16 respectively illustrate a block diagram 1400, a flowchart of a method 1500, and a further block diagram 1600 for adaptive speech intelligibility control for speech privacy, according to examples. The block diagram 1400, the method 1500, and the block diagram 1600 may be implemented on the apparatus 100 described above with reference to FIG. 1 by way of example and not limitation. The block diagram 1400, the method 1500, and the block diagram 1600 may be practiced in other apparatus. In addition to showing the block diagram 1400, FIG. 14 shows hardware of the apparatus 100 that may execute the instructions of the block diagram 1400. The hardware may include a processor 1402, and a memory 1404 storing machine readable instructions that when executed by the processor cause the processor to perform the instructions of the block diagram 1400. The memory 1404 may represent a non-transitory computer readable medium. FIG. 15 may represent a method for adaptive speech intelligibility control for speech privacy, and the steps of the method. FIG. 16 may represent a non-transitory computer readable medium 1602 having stored thereon machine readable instructions to provide adaptive speech intelligibility control for speech privacy. The machine readable instructions, when executed, cause a processor 1604 to perform the instructions of the block diagram 1600 also shown in FIG. 16.

The processor 1402 of FIG. 14 and/or the processor 1604 of FIG. 16 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 1602 of FIG. 16), such as hardware storage devices (e.g., RAM (random access memory), ROM (read only memory), EPROM (erasable, programmable ROM), EEPROM (electrically erasable, programmable ROM), hard drives, and flash memory). The memory 1404 may include a RAM, where the machine readable instructions and data for a processor may reside during runtime.

Referring to FIGS. 1-14, and particularly to the block diagram 1400 shown in FIG. 14, at block 1406, the memory 1404 may include instructions to determine (e.g., by the noise estimate determination module 102), based on background noise at a near-end of a speaker 104, a noise estimate 106 associated with speech 108 emitted from the speaker 104.

At block 1408, the memory 1404 may include instructions to compare (e.g., by the specified factor comparison module 116), by using a specified factor, the noise estimate 106 to a speech level estimate for the speech 108 emitted from the speaker 104 (e.g., see discussion with respect to FIGS. 3-5).

At block 1410, the memory 1404 may include instructions to determine (e.g., by the gain value determination module 118), based on the comparison, a gain value 114 to be applied to the speaker 104 to produce the speech 108 at a specified level to maintain on-axis intelligibility with respect to the speaker 104.

At block 1412, the memory 1404 may include instructions to apply (e.g., by the gain value application module 120) the gain value 114 to the speaker 104.

According to an example, the speaker 104 may include an ultrasonic modulator to modulate the speech 108, and a piezo-transducer to receive the modulated speech 108 and to generate a directional audio wavefront for a target listener 126 at a specified location.

According to an example, the machine readable instructions to determine (e.g., by the noise estimate determination module 102), based on the background noise at the near-end of the speaker 104, the noise estimate 106 associated with the speech 108 emitted from the speaker 104 further comprise machine readable instructions to determine, based on the background noise at the near-end of the speaker 104 and by substantially eliminating near-end speech 108 emitted from the speaker 104, the noise estimate 106 associated with the speech 108 emitted from the speaker 104.

According to an example, the machine readable instructions to compare (e.g., by the specified factor comparison module 116), by using the specified factor, the noise estimate 106 to the speech level estimate for the speech 108 emitted from the speaker 104 further comprise machine readable instructions to compare, by using the specified factor that includes a masking threshold, the noise estimate 106 to the speech level estimate for the speech 108 emitted from the speaker 104.

According to an example, the machine readable instructions to compare (e.g., by the specified factor comparison module 116), by using the specified factor, the noise estimate 106 to the speech level estimate for the speech 108 emitted from the speaker 104 further comprise machine readable instructions to compare, by using the specified factor that includes an intelligibility index, an articulation index, or a speech transmission index, the noise estimate 106 to the speech level estimate for the speech 108 emitted from the speaker 104.

According to an example, the machine readable instructions to apply (e.g., by the gain value application module 120) the gain value 114 to the speaker 104 further comprise machine readable instructions to determine, based on speech pre-processing 110, a modulated ultrasound level estimation of far-end speech 108, and apply the gain value 114 and the modulated ultrasound level estimation to the speaker 104.

According to an example, the machine readable instructions to determine (e.g., by the gain value determination module 118), based on the comparison, the gain value 114 to be applied to the speaker 104 to produce the speech 108 at the specified level to maintain the on-axis intelligibility with respect to the speaker 104 further comprise machine readable instructions to determine, by using a camera 124, a distance of a target listener 126 from the speaker 104, and determine, based on the comparison and the distance of the target listener 126 from the speaker 104, the gain value 114 to be applied to the speaker 104 to produce the speech 108 at the specified level to maintain the on-axis intelligibility with respect to the speaker 104.

Referring to FIGS. 1-13, and 15, and particularly FIG. 15, for the method 1500, at block 1502, the method may include determining (e.g., by the noise estimate determination module 102) based on background noise at a near-end of a speaker 104, a noise estimate 106 associated with speech 108 emitted from the speaker 104.

At block 1504, the method may include comparing (e.g., by the specified factor comparison module 116), by using a specified factor, the noise estimate 106 to a speech level estimate for the speech 108 emitted from the speaker 104.

At block 1506, the method may include determining (e.g., by the camera-based tracking module 122), by using a camera 124, a distance of a target listener 126 from the speaker 104.

At block 1508, the method may include determining (e.g., by the gain value determination module 118), based on the comparison and the distance of the target listener 126 from the speaker 104, a gain value 114 to be applied to the speaker 104 to produce the speech 108 at a specified level to maintain on-axis intelligibility with respect to the speaker 104.

At block 1510, the method may include applying (e.g., by the gain value application module 120) the gain value 114 to the speaker 104.

According to an example, for the method 1500, determining (e.g., by the camera-based tracking module 122), by using the camera 124, the distance of the target listener 126 from the speaker 104 may further include determining a set of reference values, each reference value including a person type, a distance of a person associated with the person type from a reference point, and a facial size of the person, detecting, by using the camera 124, a face of the target listener 126 of the speaker 104, extracting facial features of the detected face of the target listener 126, classifying, based on the extracted facial features, the person type of the target listener 126, and determining, based on a comparison of the person type of the target listener 126 and a facial size of the detected face of the target listener 126 to the reference values, the distance of the target listener 126 from the speaker 104 (e.g., see discussion with respect to FIG. 6).

According to an example, for the method 1500, determining (e.g., by the camera-based tracking module 122), by using the camera 124, the distance of the target listener 126 from the speaker 104 may further include ascertaining a plurality of images with reference to a marker positioned at a specified distance and specified orientation, each of the plurality of images including a person, classifying, based on learning, each of the plurality of images in association with a distance of the person from the marker, ascertaining, by the camera 124, an image of the target listener 126, analyzing, based on the classified plurality of images, the ascertained image of the target listener 126, and determining, based on the analysis of the ascertained image of the target listener 126, the distance of the target listener 126 from the speaker 104 (e.g., see discussion with respect to FIGS. 7-10).

According to an example, for the method 1500, determining (e.g., by the camera-based tracking module 122), by using the camera 124, the distance of the target listener 126 from the speaker 104 may further include ascertaining a plurality of images, each of the plurality of images including a person and an object, classifying, based on learning, each of the plurality of images in association with a distance of the person from the object, ascertaining, by the camera 124, an image of the target listener 126, analyzing, based on the classified plurality of images, the ascertained image of the target listener 126, and determining, based on the analysis of the ascertained image of the target listener 126, the distance of the target listener 126 from the speaker 104 (e.g., see discussion with respect to FIGS. 11A-11B).

Referring to FIGS. 1-13, and 16, and particularly FIG. 16, for the block diagram 1600, at block 1606, the non-transitory computer readable medium 1602 may include instructions to determine (e.g., by the noise estimate determination module 102), based on background noise at a near-end of a speaker 104, a noise estimate 106 associated with speech 108 emitted from the speaker 104.

At block 1608, the non-transitory computer readable medium 1602 may include instructions to compare (e.g., by the specified factor comparison module 116), by using a masking threshold, a speech intelligibility index, an articulation index, or a speech transmission index, the noise estimate 106 to a speech level estimate for the speech 108 emitted from the speaker 104.

At block 1610, the non-transitory computer readable medium 1602 may include instructions to determine (e.g., by the gain value determination module 118), based on the comparison, a gain value 114 to be applied to the speaker 104 to produce the speech 108 at a specified level to maintain on-axis intelligibility with respect to the speaker 104.

At block 1612, the non-transitory computer readable medium 1602 may include instructions to apply (e.g., by the gain value application module 120) the gain value 114 to the speaker 104.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An adaptive speech intelligibility control for speech privacy apparatus comprising:
   a processor; and
   a memory storing machine readable instructions that when executed by the processor cause the processor to:
   determine, based on background noise at a near-end of a speaker, a noise estimate associated with speech emitted from the speaker;
   compare, by using a specified factor that includes utilizing a masking threshold below which presence of any speech is rendered inaudible, the noise estimate to a speech level estimate for the speech emitted from the speaker;
   determine, based on the comparison, a gain value to be applied to the speaker to produce the speech at a specified level to maintain on-axis intelligibility with respect to the speaker;
   determine, based on applying a non-linear acoustic model, a modulated ultrasound level estimation of far-end speech; and
   apply the gain value and the modulated ultrasound level estimation to the speaker.

2. The apparatus according to claim 1, wherein the speaker includes an ultrasonic modulator to modulate the speech, and a piezo-transducer to receive the modulated speech and to generate a directional audio wavefront for a target listener at a specified location.

3. The apparatus according to claim 1, wherein the machine readable instructions to determine, based on the background noise at the near-end of the speaker, the noise estimate associated with the speech emitted from the speaker further comprise machine readable instructions to cause the processor to:
   determine, based on the background noise at the near-end of the speaker and by substantially eliminating near-end speech emitted from the speaker, the noise estimate associated with the speech emitted from the speaker.

4. The apparatus according to claim 1, wherein the machine readable instructions to compare, by using the specified factor, the noise estimate to the speech level estimate for the speech emitted from the speaker further comprise machine readable instructions to cause the processor to:
   compare, by using the specified factor that includes an articulation index, the noise estimate to the speech level estimate for the speech emitted from the speaker.

5. The apparatus according to claim 1, wherein the machine readable instructions to determine, based on the comparison, the gain value to be applied to the speaker to produce the speech at the specified level to maintain the on-axis intelligibility with respect to the speaker further comprise machine readable instructions to cause the processor to:
   determine, by using a camera, a distance of a target listener from the speaker; and
   determine, based on the comparison and the distance of the target listener from the speaker, the gain value to be applied to the speaker to produce the speech at the specified level to maintain the on-axis intelligibility with respect to the speaker.

6. The apparatus according to claim 1, wherein the machine readable instructions to compare, by using the specified factor, the noise estimate to the speech level estimate for the speech emitted from the speaker further comprise machine readable instructions to cause the processor to:
   compare, by using the specified factor that includes a speech transmission index, the noise estimate to the speech level estimate for the speech emitted from the speaker.

7. The apparatus according to claim 1, wherein the machine readable instructions further comprise machine readable instructions to:
   determine, by using a camera, a distance of a target listener from the speaker; and
   determine a set of reference values, the set of reference values including a person type, a distance of a person associated with the person type from a reference point, and a facial size of the person.

8. The apparatus according to claim 7, wherein the machine readable instructions further comprise machine readable instructions to detect, by using the camera, a face of the target listener of the speaker.

9. The apparatus according to claim 8, wherein the machine readable instructions further comprise machine readable instructions to extract facial features of the detected face of the target listener.

10. The apparatus according to claim 9, wherein the machine readable instructions to further comprise machine readable instructions to classify, based on the extracted facial features, the person type of the target listener.

11. The apparatus according to claim 10, wherein the machine readable instructions to further comprise machine readable instructions to determine, based on a comparison of the person type of the target listener and a facial size of the detected face of the target listener to the reference values, the distance of the target listener from the speaker.

12. A method for adaptive speech intelligibility control for speech privacy comprising:
    determining, by a processor, based on background noise at a near-end of a speaker, a noise estimate associated with speech emitted from the speaker;
    comparing, by using a specified factor that includes utilizing a masking threshold below which presence of any speech is rendered inaudible, the noise estimate to a speech level estimate for the speech emitted from the speaker;
    determining, by using a camera, a distance of a target listener from the speaker; and
    determining, based on the comparison and the distance of the target listener from the speaker, a gain value to be applied to the speaker to produce the speech at a specified level to maintain on-axis intelligibility with respect to the speaker;
    determining, based on applying a non-linear acoustic model, a modulated ultrasound level estimation of far-end speech; and
    applying the gain value and the modulated ultrasound level estimation to the speaker.

13. The method according to claim 12, wherein determining, by using the camera, the distance of the target listener from the speaker further comprises:
    determining a set of reference values, the set of reference values including a person type, a distance of a person associated with the person type from a reference point, and a facial size of the person;

detecting, by using the camera, a face of the target listener of the speaker;

extracting facial features of the detected face of the target listener;

classifying, based on the extracted facial features, the person type of the target listener; and determining, based on a comparison of the person type of the target listener and a facial size of the detected face of the target listener to the reference values, the distance of the target listener from the speaker.

14. The method according to claim 12, wherein determining, by using the camera, the distance of the target listener from the speaker further comprises:

ascertaining a plurality of images with reference to a marker positioned at a specified distance and specified orientation, each of the plurality of images including a person;

classifying, based on learning, each of the plurality of images in association with a distance of the person from the marker;

ascertaining, by the camera, an image of the target listener;

analyzing, based on the classified plurality of images, the ascertained image of the target listener; and determining, based on the analysis of the ascertained image of the target listener, the distance of the target listener from the speaker.

15. The method according to claim 12, wherein determining, by using the camera, the distance of the target listener from the speaker further comprises:

ascertaining a plurality of images, each of the plurality of images including a person and an object;

classifying, based on learning, each of the plurality of images in association with a distance of the person from the object;

ascertaining, by the camera, an image of the target listener;

analyzing, based on the classified plurality of images, the ascertained image of the target listener; and determining, based on the analysis of the ascertained image of the target listener, the distance of the target listener from the speaker.

16. A non-transitory computer readable medium having stored thereon machine readable instructions to provide adaptive speech intelligibility control for speech privacy, the machine readable instructions, when executed, cause a processor to:

determine, based on background noise at a near-end of a speaker, a noise estimate associated with speech emitted from the speaker;

compare, by using a masking threshold below which presence of any speech is rendered inaudible, a speech intelligibility index, an articulation index, or a speech transmission index, the noise estimate to a speech level estimate for the speech emitted from the speaker;

determine, based on the comparison, a gain value to be applied to the speaker to produce the speech at a specified level to maintain on-axis intelligibility with respect to the speaker;

determine, based on applying a non-linear acoustic model, a modulated ultrasound level estimation of far-end speech; and apply the gain value and the modulated ultrasound level estimation to the speaker.

17. The non-transitory computer readable medium according to claim 16, wherein the machine readable instructions to determine, based on the background noise at the near-end of the speaker, the noise estimate associated with the speech emitted from the speaker, when executed, further cause the processor to:

determine, based on the background noise at the near-end of the speaker and by substantially eliminating near-end speech emitted from the speaker, the noise estimate associated with the speech emitted from the speaker.

18. The non-transitory computer readable medium according to claim 16, wherein the machine readable instructions to determine, based on the comparison, the gain value to be applied to the speaker to produce the speech at the specified level to maintain the on-axis intelligibility with respect to the speaker, when executed, further cause the processor to:

determine, by using a camera, a distance of a target listener from the speaker; and determine, based on the comparison and the distance of the target listener from the speaker, the gain value to be applied to the speaker to produce the speech at the specified level to maintain the on-axis intelligibility with respect to the speaker.

* * * * *